(12) United States Patent
Higashi et al.

(10) Patent No.: US 11,037,709 B2
(45) Date of Patent: Jun. 15, 2021

(54) VARISTOR AND MANUFACTURING METHOD THEREOF

(71) Applicant: Panasonic Intellectual Property Management Co., Ltd., Osaka (JP)

(72) Inventors: Yoshiko Higashi, Osaka (JP); Eiichi Koga, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/955,877

(22) PCT Filed: Feb. 18, 2019

(86) PCT No.: PCT/JP2019/005741
§ 371 (c)(1),
(2) Date: Jun. 19, 2020

(87) PCT Pub. No.: WO2019/187763
PCT Pub. Date: Oct. 3, 2019

(65) Prior Publication Data
US 2020/0402688 A1    Dec. 24, 2020

(30) Foreign Application Priority Data

Mar. 26, 2018    (JP) .............................. JP2018-057384

(51) Int. Cl.
*H01C 7/112*    (2006.01)
*H01C 7/12*    (2006.01)
*H01C 17/00*    (2006.01)
*C04B 35/453*    (2006.01)
*H01L 27/02*    (2006.01)

(52) U.S. Cl.
CPC ............ *H01C 7/112* (2013.01); *C04B 35/453* (2013.01); *H01C 7/12* (2013.01); *H01C 17/00* (2013.01); *H01L 27/0248* (2013.01)

(58) Field of Classification Search
CPC .......... H01C 7/112; H01C 7/12; H01C 17/00; C04B 35/453
See application file for complete search history.

(56) References Cited

U.S. PATENT DOCUMENTS 5,952,040 A * 9/1999 Yadav ...................... B82Y 5/00
                                                                    427/125
7,559,494 B1 * 7/2009 Yadav .................... B82Y 30/00
                                                                    241/23
(Continued)

FOREIGN PATENT DOCUMENTS

JP    2002-015903    1/2002
JP    2002-121067    4/2002
(Continued)

OTHER PUBLICATIONS

International Search Report of PCT application No. PCT/JP2019/005741 dated May 7, 2019.

*Primary Examiner* — Kyung S Lee
(74) *Attorney, Agent, or Firm* — McDermott Will and Emery LLP

(57) ABSTRACT

A chromaticity of zinc oxide is measured. The durability of a zinc oxide varistor is evaluated based on the chromaticity. This provides a varistor with a high durability stably.

14 Claims, 7 Drawing Sheets

(56) References Cited

U.S. PATENT DOCUMENTS

| | | | |
|---|---|---|---|
| 8,562,871 B2* | 10/2013 | Khatua | C09C 1/36 |
| | | | 252/511 |
| 8,871,670 B2* | 10/2014 | Seebauer | B01J 27/14 |
| | | | 502/300 |
| 2003/0207112 A1* | 11/2003 | Yadav | C01G 53/00 |
| | | | 428/402 |
| 2016/0379739 A1 | 12/2016 | Uchida et al. | |
| 2019/0154520 A1* | 5/2019 | Suchy | G01K 11/12 |

FOREIGN PATENT DOCUMENTS

| | | |
|---|---|---|
| JP | 4070780 B | 4/2008 |
| JP | 2017-017066 | 1/2017 |

* cited by examiner

VARISTOR AND MANUFACTURING METHOD THEREOF

CROSS-REFERENCE TO RELATED APPLICATIONS

This application is a U.S. national stage application of the PCT international application No. PCT/JP2019/005741 filed on Feb. 18, 2019, which claims the benefit of foreign priority of Japanese patent application No. 2018-057384 filed on Mar. 26, 2018, the contents all of which are incorporated herein by reference.

TECHNICAL FIELD

The present invention relates to a varistor protecting a semiconductor device or the like from a surge or static electricity, and to a manufacturing method thereof.

BACKGROUND ART

When an abnormal voltage, such as a surge or static electricity, is applied to a semiconductor integrated circuit (IC) in a circuit of an electronic device, a malfunction or crash can occur in the electronic device. A varistor is used as an electronic component protecting the electronic device from such an abnormal voltage. Conventional varistors made of zinc oxide sintered bodies are disclosed in, e.g. PTLs 1 and 2.

CITATION LIST

Patent Literature

PTL 1: Japanese Patent Laid-Open Publication No. 2002-15903
PTL 2: Japanese Patent No. 4070780

SUMMARY

A chromaticity of zinc oxide of a varistor is measured. The durability of the zinc oxide varistor is evaluated based on the chromaticity. This provides a varistor with a high durability stably.

DETAIL DESCRIPTION OF PREFERRED EMBODIMENT

Any of the exemplary embodiments described later shows one specific example. A numerical value, shape, material, component, or positions and connection form of components is one example, and does not limit the present invention. Of the components in the following exemplary embodiment, the component that is not described in the independent claim showing the highest-level concept is described as any component. Hereinafter, in all drawings, the same components or the corresponding components are denoted by the same reference marks, and the duplicate descriptions of those components are omitted.

Figure 1:
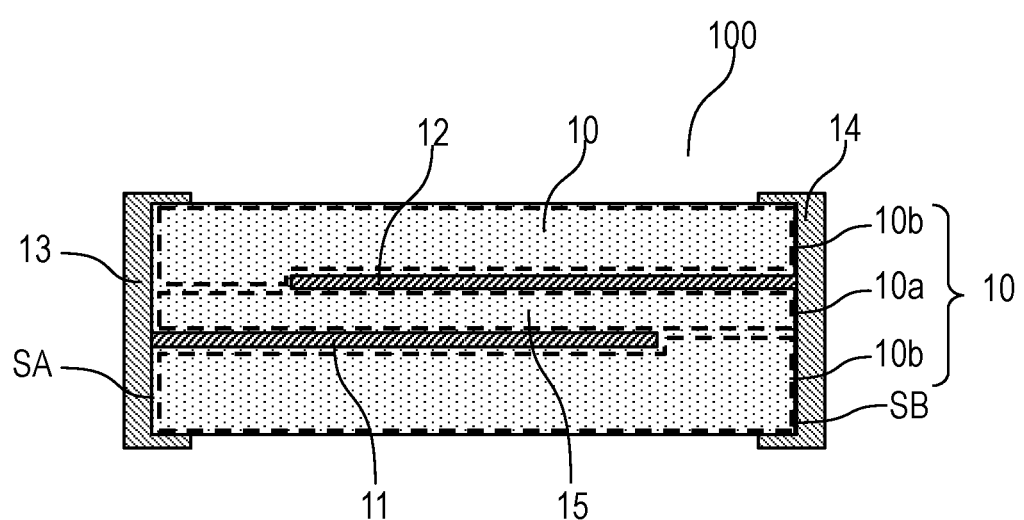
FIG. 1 is a sectional view of a varistor in accordance with an exemplary embodiment.

FIG. 1 is a sectional view of varistor 100 in accordance with an exemplary embodiment.

Varistor 100 is a laminated varistor including varistor layer 10a, internal electrode 11 contacting varistor layer 10a, and internal electrode 12 contacting varistor layer 10a and facing internal electrode 11 across varistor layer 10a. The varistor further includes two dummy layers 10b made of the same material as varistor layer 10a and contacting internal electrodes 11 and 12, respectively. Varistor layer 10a and two dummy layers 10b are integrated to constitute body 10. Internal electrode 11 is buried in body 10, and has one end exposed to end surface SA of body 10 and electrically connected to external electrode 13 on end surface SA. Internal electrode 12 is buried in body 10, and has one end exposed to end surface SB opposite to end surface SA of body 10 and electrically connected to external electrode 14 on end surface SB.

The varistor of the present disclosure is described taking the laminated varistor as an example of varistors according to exemplary, but is not limited to this. This varistor may be various varistors that are used for protecting an electronic device from an abnormal voltage.

Figure 2:
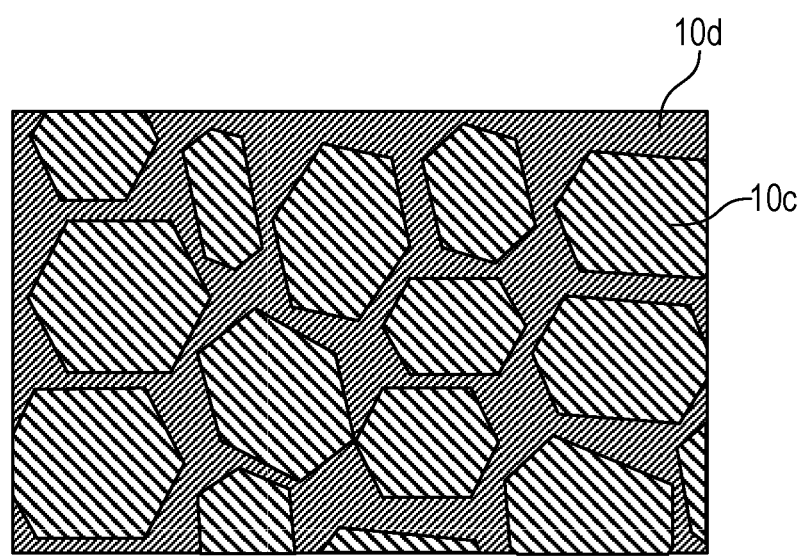
FIG. 2 is an enlarged sectional view of the varistor shown in FIG. 1.

FIG. 2 is an enlarged sectional view of varistor 100 shown in FIG. 1 for enlargedly illustrating a part of body 10. Body 10 mainly contains zinc oxide particles 10c, and further contains oxide layer 10d. Oxide layer 10d contain bismuth, cobalt, manganese, antimony, nickel, and germanium. Each zinc oxide particle 10c has a crystal structure made of a hexagonal system. Oxide layer 10d is disposed among zinc oxide particles 10c.

Body 10 is a nonlinear voltage-dependable resistor composition containing zinc oxide particles 10c and oxide layer 10d disposed among zinc oxide particles 10c. A chromaticity b* of the nonlinear voltage-dependable resistor composition in the L*a*b* colorimetric system satisfies 0<b*≤0.95, and varistor 100 have a larger nonlinear voltage-dependency than conventional varistors. In the case that b*>0.95 is satisfied, the nonlinearity decreases. In the case that chromaticity b* of the nonlinear voltage-dependable resistor composition is equal to or less than 0, the particle size of the zinc oxide particles is large, and therefore, the number of particle boundaries in the nonlinear voltage-dependable resistor composition decreases, and the nonlinearity is reduced. In order to allow the chromaticity b* of the nonlinear voltage-dependable resistor composition to be within the above-mentioned range, chromaticity b* of the zinc oxide particles included in the nonlinear voltage-dependable resistor composition preferably satisfies −5<b*≤11.3.

The L*a*b* colorimetric system is typically used to represent the color of an object. This is defined by International Commission on Illumination in 1976, and is established as JIS Z 8781-4. The L*a*b* colorimetric system includes brightness L* showing the degree of brightness, and chromaticities a* and b* that are hues showing shade. Negative values of chromaticity a* represents green color, Positive values represents red color. Negative values of chromaticity b* represents blue color, Positive values represents yellow color. As the absolute values of chromaticities a* and b* increase, the colors become clear. The zinc oxide excessively includes oxygen defects and interstitial Zn, and has the electric and optical property changing in accordance with the increase and decrease of the oxygen defects and interstitial Zn. The same effect as the above-mentioned effect can be obtained also due to the elemental doping, namely the electric and optical property change. The resistivity decreases with the increase in donor concentration. At this moment, color tone changes accordingly, and the value of chromaticity b* of zinc oxide decreases. As chromaticity b* of the zinc oxide in the nonlinear voltage-dependable resistor composition decreases, the varistor has a low resistance and a preferable nonlinear voltage-dependency, and has a high durability against the reduction in heat generation due to an abnormal voltage. Zinc oxide has a high contact resistance, and largely affects the measurement of the resistivity. The difference in the measurement method or in the surface state causes a large difference in the measured value. In contrast, the measurement of the hue is performed in non-contact and does not require the production of an electrode is not required. Therefore, the hue may be measured easily and accurately. By using the chromaticity as an index of the evaluation, the resistivity of the zinc oxide may be evaluated accurately and universally, and improves the reliability of the varistor.

The nonlinear voltage-dependency of the varistor will be described. The resistance of the varistor decreases sharply at a certain voltage value applied thereto. Thus, the varistor has a nonlinear characteristic in the relation between the voltage and current. In the present disclosure, the nonlinearity is indicated as voltage ratio $\alpha(V_{5A}/V_{1mA})$ which is the ratio of voltage value $V_{5A}$ at a current of 5 A flowing in the composition to voltage value $V_{1mA}$ at a current of 1 mA flowing in the composition.

Zinc oxide sintered body is composed of a lot of crystal particles having respective resistivities different from one another. The evaluation of the resistance of the sintered body may not allow current concentration by inhomogeneous distribution of the resistance to be detected. A sintered body having a characteristic that degrades due to the current concentration cannot be screened. The evaluation of the shapes of crystal particles may not allow the electric characteristic of the sintered body to be evaluated.

A sintered body of zinc oxide is composed of a lot of crystal particles having respective resistivities different form one another. Therefore, the zinc oxide sintered body has low-resistance particles or an inhomogeneous resistance portion. This may cause the reduction in the reliability, such as surge withstand deterioration, due to the current concentration. The evaluation of the resistance of the sintered body may not allow variation in the characteristic to be detected.

The observation of the crystal particles provides only the evaluation of the shapes thereof, and does not provide the information of essential electric characteristic. In contrast, the hue is a total value of optical characteristics closely related to a semiconductor physical property of the zinc oxide particles, and is an index having a difference in resistance characteristics of crystal. Therefore, the evaluating of the optical characteristics, such as hue, allows the distribution of the resistance of the particles constituting a sintered body to be evaluated. The characteristic difference between the particles causing the surge withstand deterioration can be evaluated based on the optical characteristics of the sintered body. Therefore, a varistor with a high reliability is selected. By previously selecting the zinc oxide particles as the starting material based on the characteristic provides a varistor sintered body constituted by homogeneous zinc oxide crystal particles, accordingly improving the reliability.

The varistor according to the present exemplary embodiment has a high nonlinear voltage-dependency.

A method of manufacturing varistor 100 will be described below.

Figure 3:
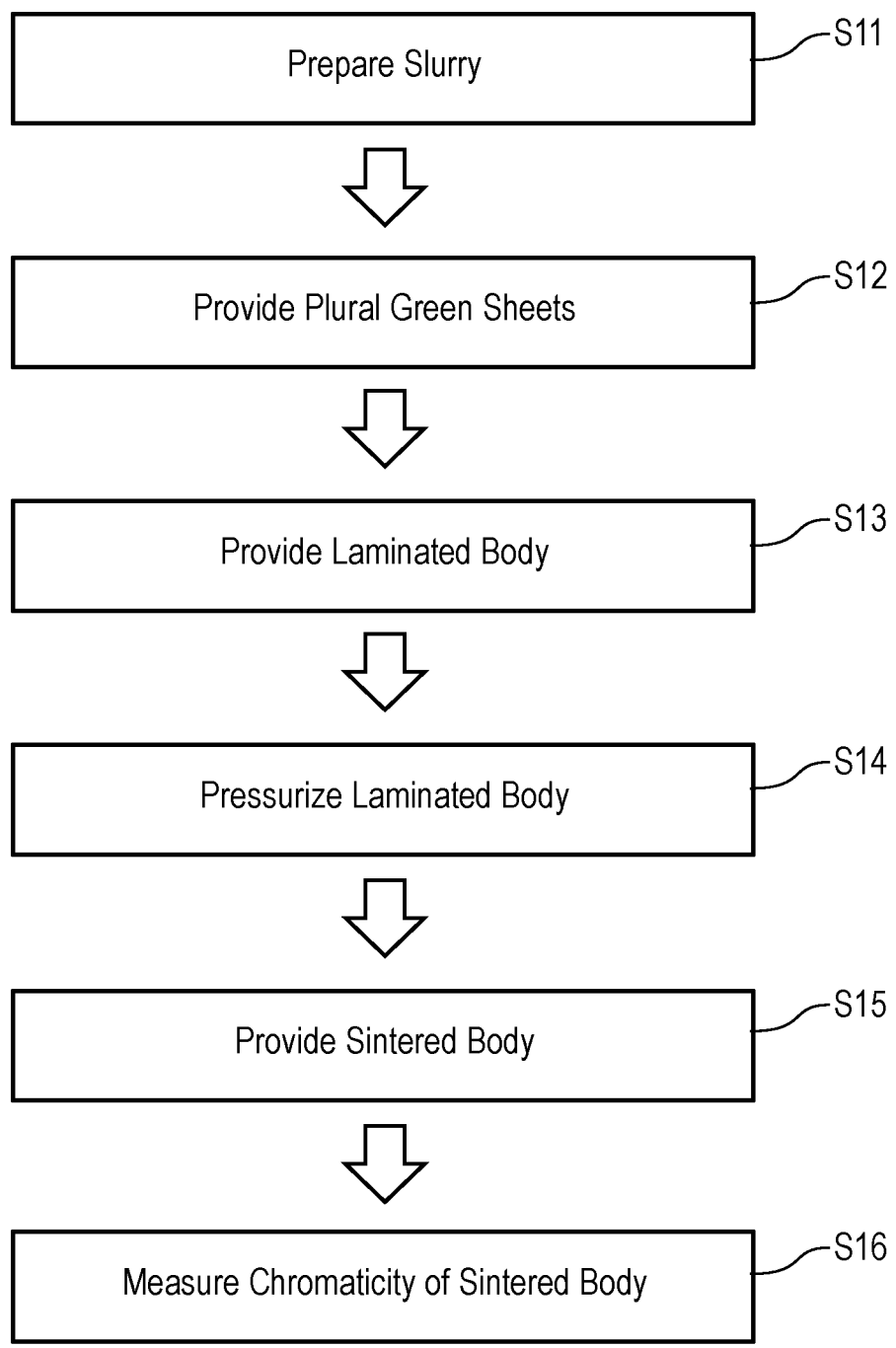
FIG. 3 is a flowchart showing a method of manufacturing the varistor in accordance with the embodiment.

FIG. 3 is a production flowchart showing processes for manufacturing varistor 100. First, as the starting material of body 10, zinc oxide powder made of zinc oxide particles is prepared. Zinc oxide powder of zinc oxide particles that are not classified by average particle size is prepared as Comparative Example 1. In the exemplary embodiment, zinc oxide particles have spherical shapes having an average particle size of 0.60 μm and the BET specific surface area distributed within a range from 2.0 to 3.7 m²/g. Pure water and polymer surfactant are added as a dispersant to the zinc oxide powder, and the resultant mixture is sufficiently stirred and then classified into three levels by a centrifugal separator. The rotation speed of the centrifugal separator ranges from 300 to 3000 rpm in accordance with a yield rate. As the classifying method, a vibrating screen method, inertia method, and filtration method are effective. The zinc oxide powder is classified into three levels in the descending order of particle size, namely, in the ascending order of BET specific surface area x: Example 1 (x≤2.2 m²/g); Example 2 (2.2 m²/g<x≤3.1 m²/g); and Comparative Example 2 (x>3.1 m²/g).

In order to obtain characteristics of the zinc oxide powder per se that has not been classified and the zinc oxide powder per se that has been classified into three levels, a predetermined amount of highly pure $Al_2O_3$ is added to each of the zinc oxide powder that has not been classified and the dried zinc oxide powder that has been classified into three levels. Then, the resultant mixture of the examples is dry-mixed, granulated, molded, and baked to be sintered at a temperature ranging from 1100° C. to 1300° C., thereby providing sintered bodies of the zinc oxide powder of Examples 1 and 2 and Comparative Examples 1 and 2. The resistivities of the obtained sintered bodies are measured by a four-terminal method. Furthermore, chromaticity b*(ZnO), which is chromaticity b* in the L*a*b* colorimetric system, of each sintered body is measured.

Bismuth oxide powder, cobalt oxide powder, manganese oxide powder, antimony oxide powder, nickel oxide powder, and germanium oxide powder that constitute oxide layer 10d are added to the classified zinc oxide powder, thereby producing a varistor.

The starting material has a composition containing 96.54 mol % of zinc oxide powder, 1.00 mol % of bismuth oxide powder, 1.06 mol % of cobalt oxide powder, 0.30 mol % of manganese oxide powder, 0.50 mol % of antimony oxide powder, 0.50 mol % of nickel oxide powder, and 0.10 mol % of germanium oxide. Slurry containing these powders and an organic binder is prepared (step S11).

Processes for producing plural green sheets will be detailed below.

Figure 4:
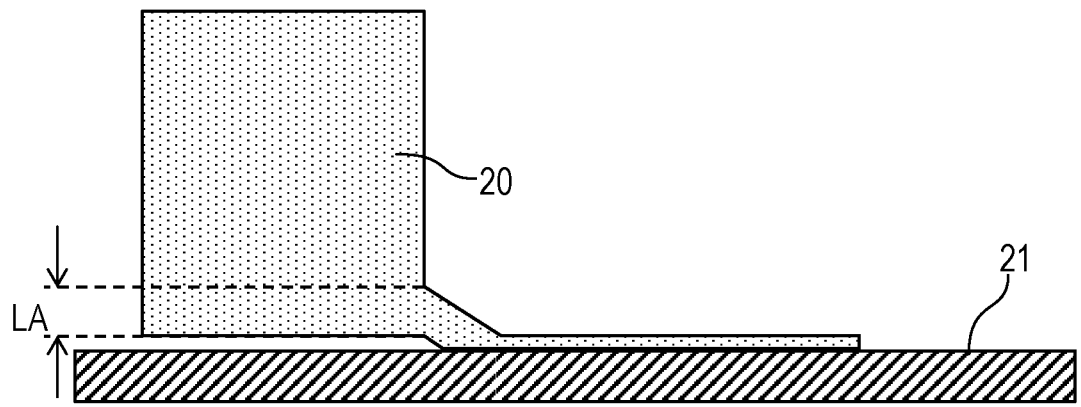
FIG. 4 is a sectional view of a manufacturing device of the varistor in accordance with the embodiment.

FIG. 4 is a schematic sectional view of a device for obtaining the green sheets.

Slurry 20 is applied through a gap of width LA onto film 21 made of polyethylene terephthalate (PET), and dried, thereby providing the green sheets (step S12) In accordance with the embodiment, width LA is 180 μm.

Next, an electrode paste containing alloy powder of silver and palladium is printed in a predetermined shape on respective surfaces of a predetermined number of green sheets. Then, the green sheets are stacked on one another, producing a laminated body (step S13).

Next, the laminated body is pressurized in a direction perpendicular to surface directions parallel with the surfaces of the green sheets (step S14). A pressurizing force during the pressurizing is 55 MPa in accordance with the embodiment, and is preferably in the range equal to or higher than 30 MPa and equal to or lower than 100 MPa. By pressurizing the laminated body at the pressure equal to or higher than 30 MPa, the laminated body has no structural defect. By pressurizing the laminated body at the pressure equal to or lower than 100 MPa, the shape of the electrode paste inside the laminated body is maintained.

Next, by baking the pressurized laminated body at a temperature ranging from 750° C. to 900° C., the sintered body including body 10 (nonlinear voltage-dependable resistor composition) and internal electrodes 11 and 12 is obtained (step S15). By this baking, the classified zinc oxide powders as the starting material become zinc oxide particles 10c shown in FIG. 2. Thus, a nonlinear voltage-dependable resistor having oxide layer 10d disposed among zinc oxide particles 10c can be obtained Next, end surfaces SA and SB of body 10 opposite to each other are coated with the electrode paste containing alloy powder of silver and palladium, and are heated at a temperature ranging from 700° C. to 830° C., thereby forming external electrodes 13 and 14. External electrodes 13 and 14 may be produced by a plating method. External electrodes 13 and 14 may include baked layers formed on end surfaces SA and SB of body 10 by baking the electrode paste; and further include plated layers formed on the baked layers by the plating method. The chromaticity of the sintered body is measured (step S16).

Then, voltage ratio α of the produced varistor is measured.

The varistor in accordance with the embodiment and the sintered body of the zinc oxide powder will be detailed. Table 1 shows resistivity ρ of the sintered body of the zinc oxide powder that is evaluated by a four-terminal method and the measured chromaticity b* (ZnO). Table 1 further shows voltage ratio α of the varistor produced by adding an additive to these zinc oxide powders, and chromaticity b*(varistor) of the body (nonlinear voltage-dependable resistor composition) of the varistor. The chromaticities of the sintered bodies of the obtained zinc oxide powder are different from one another. As particle size increases, chromaticity b*(ZnO) decreases, the bluish color becomes stronger, and resistivity ρ decreases. Thus, it can be recognized that difference in donor concentration may be evaluated through the hue. Furthermore, the lower limit of the resistivity of ZnO is about $1.0\times10^{-3}$ Ω·cm, and chromaticity b*(ZnO) at this time is estimated as −5. From this result, it is recognized that the donor concentration in the crystal depends on the particle size during generation and a crystal particle of a large size has a lot of oxygen defects. By removing the particles with a micro size by classification, and by using the particles of a large size, the distribution of the donor concentration of the particles may be reduced. Furthermore, resistivities ρ of Example 1 and Comparative Example 1 shown in Table 1 are equivalent to each other, but chromaticities b*(ZnO) thereof are 11.25 and 12.80, which are different from each other. The classified material provides a high donor concentration of the entire sintered body. Based on this result, the measurement result of resistivity ρ of Comparative Example 1 shows that the resistance of a low-resistance portion having a locally high donor concentration is revealed, and that the measurement result is strongly affected by the distribution of the characteristic of crystal particles in the sintered body. By additively evaluating the chromaticity, the information of the distribution of resistivity ρ of crystal particles that cannot be determined by the measurement of resistivity can be acquired.

TABLE 1

|  | Example 1 | Example 2 | Comparative Example 1 | Comparative Example 2 |
| --- | --- | --- | --- | --- |
| BET specific surface area (m²/g) | 2.2 < x ≤ 3.1 | x ≤ 2.2 | 2.0 < x ≤ 3.7 | x > 3.1 |
| Chromaticity b*(ZnO) | 11.25 | 6.95 | 12.8 | 15.45 |
| Resistivity ρ (Ω · cm) | 12 | 0.961 | 15 | 130 |
| Chromaticity b*(varistor) | 0.832 | 0.662 | 0.90 | 1.742 |
| Voltage ratio α | 1.34 | 1.27 | 1.36 | 1.41 |

Figure 5:
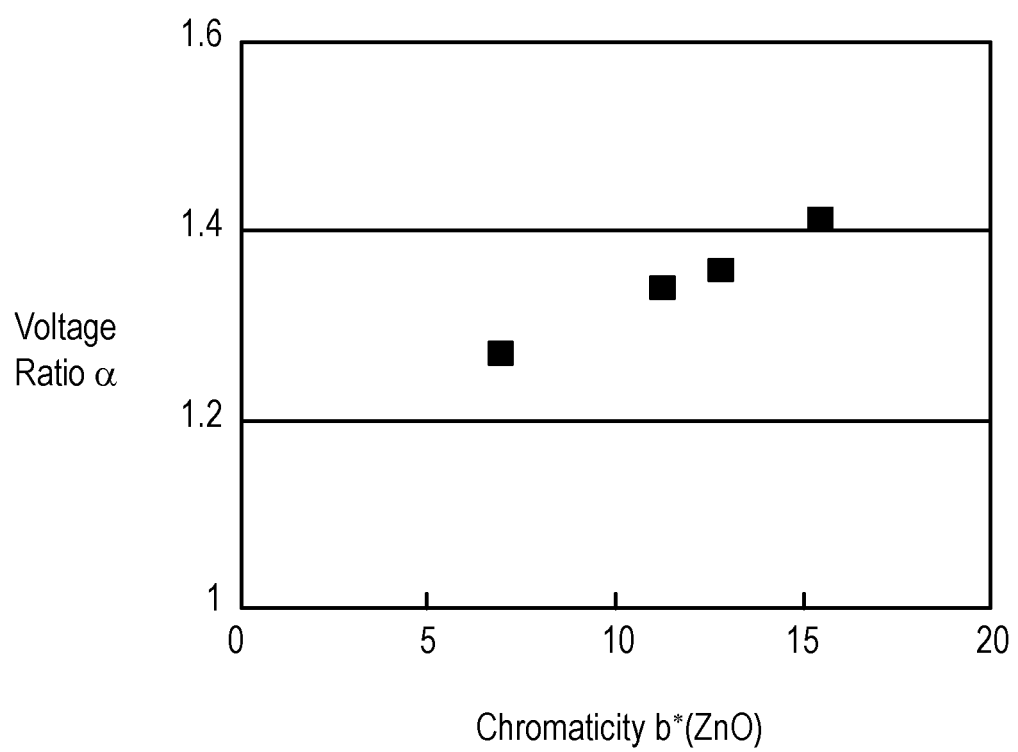
FIG. 5 shows the relationship between the chromaticity of zinc oxide particles and a voltage ratio of the varistor in accordance with the embodiment.
Figure 6:
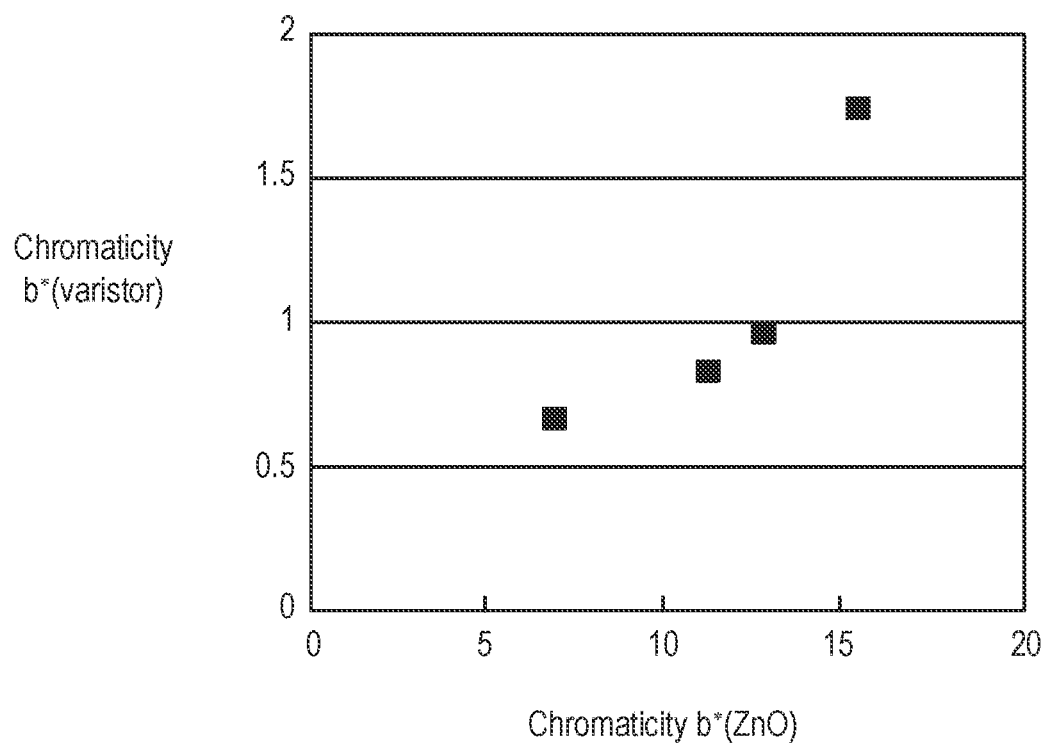
FIG. 6 shows the relationship between the chromaticity of the varistor and the chromaticity of classified zinc oxide particles in accordance with the embodiment.

FIG. 5 is a diagram showing a relationship between the voltage ratio α ($V_{5A}/V_{1mA}$) of the varistor and the measured values of chromaticity b*(ZnO) of the zinc oxide particles for bodies 10 of varistors 100 of Examples 1 and 2 and for the bodies of the varistors of Comparative Examples 1 and 2. As chromaticity b*(varistor) of the varistor increases in a negative direction and the blueness is stronger, voltage ratio α decreases. In other words, the resistivity of a large-current region decreases, and the heat generated due to the abnormal voltage applied thereto is suppressed, and the durability of the varistor increases accordingly. Chromaticity b*(ZnO) of the zinc oxide particles of Example 1 calculated from the measurement result of the chromaticity is 6.95, resistivity ρ of the sintered body of zinc oxide is $9.6\times10^{-1}$ Ω·cm, and voltage ratio α is 1.27. In contrast, chromaticity b*(ZnO) of the zinc oxide particles calculated from the chromaticity of the Comparative Example is 12.8, and resistivity ρ of the sintered body is 15 Ω·cm, and voltage ratio α is 1.36. As discussed above, voltage ratio α of varistors 100 of Examples 1 and 2 including the zinc oxide particles having a small chromaticity b*(ZnO) is smaller than voltage ratio α of the varistors of Comparative Examples 1 and 2. The difference of voltage ratio α between varistors 100 of Examples 1 and 2 and the varistors in Comparative Examples 1 and 3 results, as shown in FIG. 5, in that, as chromaticity b*(ZnO) of the zinc oxide sintered body decreases, voltage ratio α decreases, thus being improved, and the resistivity of ZnO particles decreases, and hence the durability of varistors 100 to an abnormal voltage improves. FIG. 6 shows a relationship between the measured chromaticity b*(varistor) of the sintered body of the compositions of the varistors of Examples 1 and 2 and chromaticity b*(ZnO) of classified zinc oxide particles used as material thereof. Here, the classified zinc oxide particles are shown in Examples 1 and 2 and Comparative Examples 1 and 2. FIG. 6 shows that chromaticity b*(varistor) is proportional to chromaticity b*(ZnO). FIG. 6 shows that the chromaticity of zinc oxide is reflected to the chromaticity of zinc oxide in the composition of the varistor. In the case that chromaticity b*(varistor) is equal to or smaller than 0, the particle size of the zinc oxide particles is large, and therefore, the number of particle boundaries of the nonlinear voltage-dependable resistor composition decreases, and the nonlinearity decreases.

The value of the voltage ratio α depends on the material structure or the composition of the oxide layer forming body 10. Oxide layer 10d of varistor 100 according to the embodiment has a material composition containing bismuth. The oxide layer further contains material, such as any one element of praseodymium and strontium, which has voltage-dependable nonlinearity other than bismuth. This configuration allows oxide layer 10d of varistor 100 according to the embodiment to further decrease voltage ratio α and to have more preferable resistance to an abnormal voltage than a conventional varistor.

The measurement of the chromaticity performed after the baking of the external electrode before resin coating and molding enables the voltage nonlinearity including the homogeneous effect to be evaluated non-destructively in a short time. While the varistor is not coated with resin and is a bare chip, the measurement of the chromaticity introduced into a packaging line. This configuration allows the measurement of the chromaticity to be performed to the whole amount of completed varistors without adding a new process line.

Figure 7:
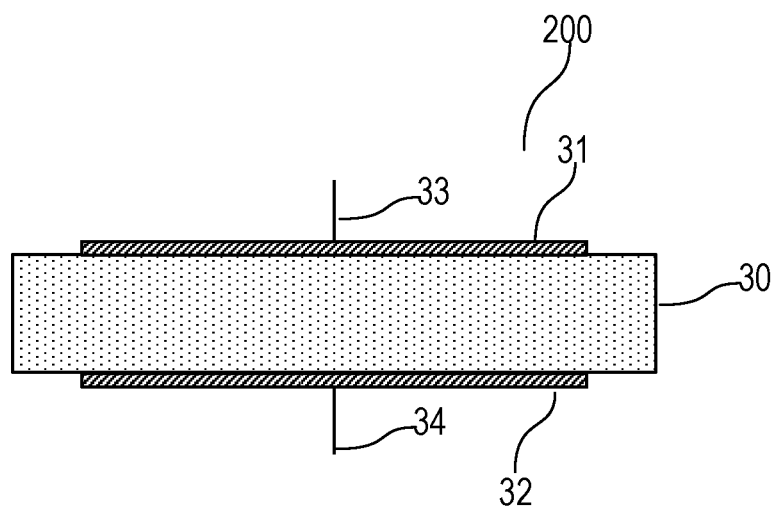
FIG. 7 is a sectional view of another varistor in accordance with the embodiment.

The measurement of the chromaticity may be applied to a varistor other than the laminated varistor. FIG. 7 is a sectional view of another varistor 200 in accordance with the embodiment. Organic binder is added to the zinc oxide powder that is blended and mixed at the composition ratio similar to that of varistor 100 as the above-described laminated varistor, and a disk-type molded body is produced. The molded body is baked at a temperature ranging from 750° C. to 900° C., thereby providing the disk-type sintered body 30 made of nonlinear voltage-dependable resistor composition. The baking causes the classified zinc oxide powder as the starting material to become zinc oxide particles 10c shown in FIG. 2, thus providing a nonlinear voltage-dependable resistor having including oxide layer 10d between zinc oxide particles 10c. In this case, chromaticity b*(varistor) of the nonlinear voltage-dependable resistor has a value similar to that of the sintered body of the laminated varistor. The chromaticity of the sintered body is measured. It is determined, based on the chromaticity, whether the sintered body is defective or not. Then, a metal paste is applied to surfaces of sintered body 30 opposite to each other, and is heated and baked at a temperature ranging from 700° C. to 830° C., thereby producing electrodes 31 and 32. Then, leads 33 and 34 are adhered to electrodes 31 and 32, respectively, and sintered body 30 is coated with a resin film.

Chromaticity b* may be efficiently measured by a chromaticity meter in non-contact. Therefore, by measuring chromaticity b* of the whole amount of sintered bodies 30 in a manufacturing process of varistor 200, and by producing electrodes 31 and 32 on sintered body 30 selected based on measured chromaticity b*, varistor 200 may be manufactured efficiently. In other words, chromaticity b* of the nonlinear voltage-dependable resistor composition of one or more sintered bodies 30 in the L*a*b* colorimetric system is measured. Sintered body 30 with measured chromaticity b* satisfying 0<b*≤0.95 is selected as a certain sintered body 30 from one or more sintered bodies 30. Electrodes 31 and 32 are produced on the selected certain sintered body 30. This selecting process provides a highly reliable varistor having a voltage nonlinearity efficiently.

The above configuration also provides varistors containing another additive, such as Pr-based additive or SrCoO$_3$-based additive, with similar effects.

INDUSTRIAL APPLICABILITY

A varistor and a manufacturing method thereof according to the present disclosure are useful as electronic components protecting electronic devices from an abnormal voltage.

REFERENCE MARKS IN THE DRAWINGS 100 varistor
10 body (nonlinear voltage-dependable resistor composition)
10a varistor layer
10b dummy layer
11 internal electrode (first electrode)
12 internal electrode (second electrode)
13 external electrode
14 external electrode
10c zinc oxide particle
10d oxide layer
20 slurry
21 film

The invention claimed is:

1. A varistor comprising:
a sintered body comprising a sintered nonlinear voltage-dependable resistor composition including:
 a plurality of zinc oxide particles; and
 an oxide layer disposed between the plurality of zinc oxide particles, the oxide layer including at least one of bismuth, praseodymium, and strontium,
wherein a chromaticity b* of the sintered nonlinear voltage-dependable resistor composition of the sintered body in an L*a*b* colorimetric system satisfies 0<b*≤0.95.

2. The varistor of claim 1, wherein a chromaticity b* of the plurality of zinc oxide particles in the L*a*b* colorimetric system satisfies −5<b*≤11.3.

3. A method of manufacturing a varistor, comprising:
preparing a mixture powder containing:
 oxide powder including at least one of bismuth, praseodymium, and strontium, and zinc oxide powder;
providing a molded body made of the mixture powder;
providing a sintered body comprising sintered nonlinear voltage-dependable resistor composition by baking the molded body;
measuring a chromaticity of the sintered nonlinear voltage-dependable resistor composition of the sintered body; and
determining, based on the measured chromaticity, whether the sintered body is defective or not.

4. The method of claim 3, wherein
said measuring the chromaticity of the sintered nonlinear voltage-dependable resistor composition of the sintered body comprises measuring a chromaticity b* of the sintered nonlinear voltage-dependable resistor composition of the sintered body in a L*a*b* colorimetric system, and said determining whether the sintered body is defective or not comprises determining whether or not the measured chromaticity b* satisfies 0<b*≤0.95.

5. The method of claim 3, wherein
said providing the molded body comprises providing one or more molded bodies made of the mixture powder,
said providing the sintered body by baking the molded body comprises providing one or more sintered bodies made of the sintered nonlinear voltage-dependable resistor composition by baking the one or more molded bodies, said measuring the chromaticity of the sintered nonlinear voltage-dependable resistor composition of the sintered body comprises measuring respective chromaticities of the sintered nonlinear voltage-dependable resistor composition of the one or more sintered bodies, and said determining, based on the measured chromaticity, whether the sintered body is defective or not comprises determining, based on the respective measured chromaticities, whether the one or more sintered bodies are is defective or not, the method further comprising selecting a certain sintered body from the one or more sintered bodies based on a determination result of whether the one or more sintered bodies are defective or not.

6. The method of claim 5, wherein said measuring the respective chromaticities of the sintered nonlinear voltage-dependable resistor composition of the one or more sintered bodies comprises measuring respective chromaticities $b^*$ of sintered nonlinear voltage-dependable resistor composition of the one or more sintered bodies in the $L^*a^*b^*$ colorimetric system, said determining whether the one or more sintered bodies are defective or not comprises determining whether or not the respective measured chromaticities $b^*$ of the sintered nonlinear voltage-dependable resistor composition of the one or more sintered bodies satisfy $0<b^*\leq 0.95$, and said selecting the certain sintered body from the one or more sintered bodies based on the determination result of whether the one or more sintered bodies are defective or not bodies comprises selecting, as the certain sintered body, a sintered body of the one or more sintered bodies which has a measured chromaticity $b^*$ of the sintered nonlinear voltage-dependable resistor composition satisfying $0<b^*\leq 0.95$.

7. The method of claim 6, further comprising producing an electrode on the certain sintered body.

8. The method of claim 3, wherein the chromaticity $b^*$ of the zinc oxide powder in the $L^*a^*b^*$ colorimetric system satisfies $-5<b^*\leq 11.3$.

9. The method of claim 3, wherein said providing the molded body comprises:

providing slurry containing the mixture powder;

providing a plurality of green sheets by molding the slurry; and providing a laminated body by stacking an electrode paste and the plurality of green sheets, and said providing the sintered body comprises providing the sintered body by baking the laminated body.

10. The method of claim 9, wherein said providing the plurality of green sheets comprises applying the slurry onto a film.

11. The method of claim 9, wherein the slurry further contains organic solvent.

12. The method of claim 3, wherein said providing the molded body comprises providing the molded body by pressurizing and molding the mixture powder.

13. The method of claim 12, further comprising providing an electrode by applying a metal paste onto the sintered body and heating the metal paste applied onto the sintered body.

14. The method of claim 11, further comprising providing an electrode by applying a metal paste onto the sintered body and heating the metal paste applied onto the sintered body.

* * * * *